United States Patent [19]

Koelle et al.

[11] Patent Number: 4,864,158

[45] Date of Patent: Sep. 5, 1989

[54] RAPID SIGNAL VALIDITY CHECKING APPARATUS

[75] Inventors: Alfred R. Koelle, Santa Fe; Donald F. Speirs, San Juan; Peter L. Hendrick, Los Alamos, all of N. Mex.

[73] Assignee: Amtech Corporation, Santa Fe, N. Mex.

[21] Appl. No.: 149,609

[22] Filed: Jan. 28, 1988

[51] Int. Cl.$^4$ ............................ H03K 5/26; H04B 1/10
[52] U.S. Cl. ..................................... 307/231; 307/518; 328/112; 328/119; 377/33; 377/45; 371/55
[58] Field of Search ............... 307/231, 518, 528, 234; 328/108–112, 119, 130.1; 377/33, 51, 107, 45; 342/44; 371/55

[56] References Cited

U.S. PATENT DOCUMENTS

| | | | |
|---|---|---|---|
| 3,938,146 | 2/1976 | Dano | 328/110 |
| 3,980,960 | 9/1976 | Hutchinson | 328/112 |
| 4,068,211 | 1/1978 | Van Tol | 342/44 |
| 4,169,264 | 9/1979 | Parker | 328/119 |
| 4,197,502 | 4/1980 | Summer et al. | 307/518 |
| 4,322,686 | 3/1982 | Butin | 307/518 |
| 4,617,677 | 10/1986 | Chiba | 328/112 |
| 4,627,075 | 12/1986 | Fleming, III et al. | 307/234 |
| 4,739,328 | 4/1988 | Koelle et al. | 342/44 |

Primary Examiner—John S. Heyman
Assistant Examiner—Tai V. Duong
Attorney, Agent, or Firm—Blakely, Sokoloff, Taylor & Zafman

[57] ABSTRACT

This invention relates to an improved signal reader for reading signals from transponders placed on moveable objects such as ship containers, automobiles or railroad cars. The reader sends out a continuous signal, which is modified by the information contained in the transponder attached to the moveable object. Multiple antennas, each of which receive separate signals, may be multiplexed at the reader. The improved circuit of the invention provides quick recognition of the receipt of a valid signal from a transponder or, in the alternative, the absence of such a valid signal.

2 Claims, 1 Drawing Sheet

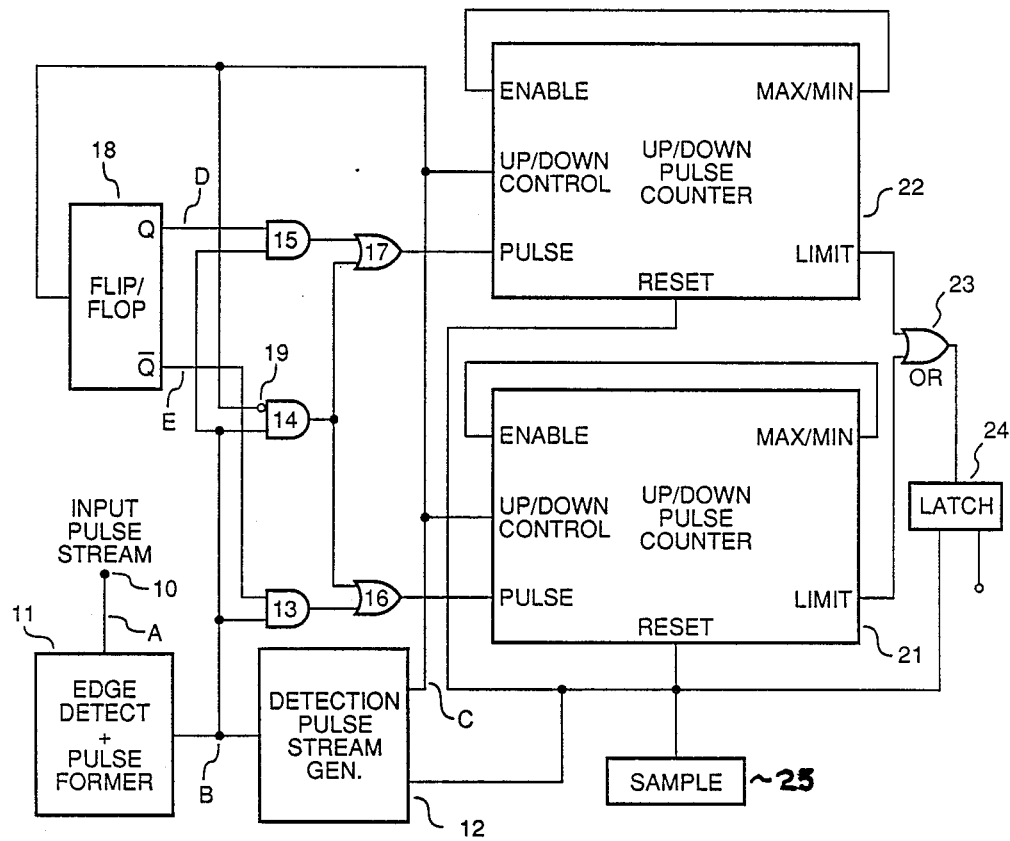
FIGURE 1 PULSE DETECTION CIRCUIT
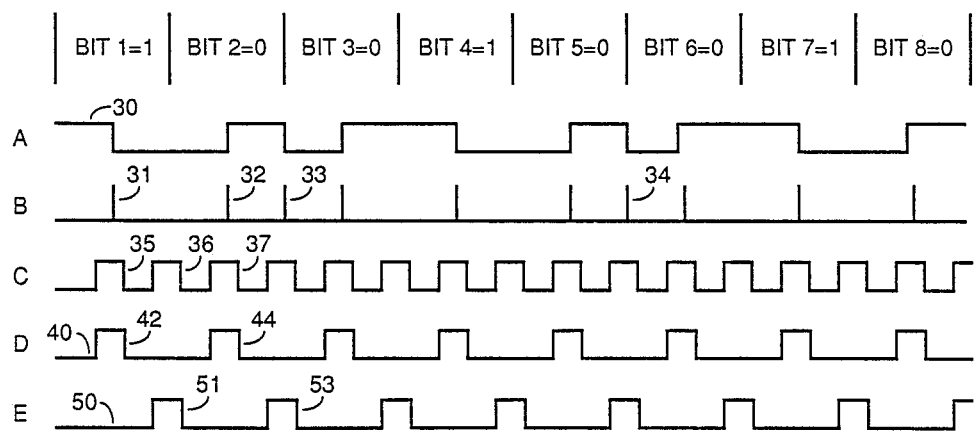
FIGURE 2 PULSE DETECTION CIRCUIT

RAPID SIGNAL VALIDITY CHECKING APPARATUS

BACKGROUND OF THE INVENTION

This invention relates to systems for identifying objects on a remote basis. The system includes a reader for providing a simple and reliable identification of an object which is a considerable distance away by detecting a unique sequence of signal cycles identifying the object.

As commerce becomes increasingly complex, the volume of moving articles and vehicles requiring individual identification increases. For example, containers holding goods are stacked on merchant ships. When the merchant ships reach a destination port, only a portion of the containers need to be unloaded, the remaining ones staying on the ship for subsequent destination ports. It is thus desirable to identify the containers remotely, as they are being loaded or unloaded.

Systems of this nature have been developed. Such systems include a reader, displaced from the object, for transmitting a signal which interrogates an electronic transponder tag on the object. The tag has an identifying code which is unique to the object being interrogated. This code is represented by a sequence of binary 1's and 0's. Each binary 1 and 0 in this sequence is converted to a plurality of signal cycles having a predetermined periodicity which are transmitted to the reader. The signal cycles in each plurality are made up of portions having two different frequencies in a particular pattern, one pattern to identify a binary "1" and another pattern to identify a binary "0". The antenna at the reader picks up a signal reflected from the transponder at the object which contains the unique signals from the object.

In some applications, systems of this type employ a single reader to read multiplexed signals from several antennas. For example, it is sometimes desirable to read data from electronic tags on passing railroad cars. These cars often have transponder tags only on one side of the car. However, since railroad cars commonly get turned around, one never knows on which side of the track the tag will be. Therefore one must have an antenna on both sides of the track.

One simple solution, of course, would be to have two antennas and two readers, one on each side of the track. Alternatively, of course, one can put tags on both sides of the railroad car. Both of these are obviously wasteful solutions. A better solution is to have a single tag on each car with antennas on opposite sides of the track, both multiplexed to a single reader.

The difficulty with this solution is that the multiplexing of the two antenna inputs to a single reader must be extremely fast. The reader must be able to determine quickly that there is no signal from one antenna, and still have time to check the antenna on the other side of the rapidly passing railroad car for a signal from a tag on the opposite side.

With the readers which were available prior to this invention, the only way the presence or absence of a tag signal could be ascertained was to completely read all of the information contained in the tag and make computations to see if it was valid information. If invalid, the reader became free to be switched to another antenna. If this technique were employed with fast moving railroad cars, it is likely that by the time the computer ascertained that there was no tag present on one side, and switched to receive signals from the antenna on the opposite side of the car, the tag, if any, on the second side would have passed beyond the antenna's range.

These same systems are also used to identify automobiles in toll booth lanes for automatic toll collection. Where a single reader is to be multiplexed to several antennas in several lanes approaching the toll booth, if the absence of a car cannot be detected quickly, more readers must be used for fewer lanes, perhaps even one reader for each lane.

BRIEF DESCRIPTION OF THE INVENTION

The system of the invention provides a means for quickly detecting the presence or absence of a predetermined transmitted signal without the necessity of reading and validating the entire signal, as has been required in the past. The signals transmitted to the readers of the type employed in this invention are described in copending patent application Ser. No. 885,248, filed July 14, 1986, entitled System for Identifying Particular Objects and assigned to the same assignee as this invention. They have a predetermined periodicity. The circuit of this invention takes advantage of that predetermined periodicity to provide early validation of signal receipt based upon the receipt of only a limited number of signal pulses, normally far fewer than the entire signal.

Briefly, the circuit of the invention first provides a detection pulse stream. Each pulse of the detection pulse stream coincides with or overlaps an expected or possible pulse edge of the predetermined transmitted pulse stream received at an antenna. The predetermined pulse stream is fed into a detector designed to detect the presence of the expected pulse edge coincident with the duration of a pulse from the detection pulse stream. The detector provides an output signal in the event that such coincidence is detected, and in a preferred embodiment, will also provide an output signal if a pulse edge from the transmitted pulse stream is detected during the period between pulses of the detection pulse stream when it should not be there.

Finally, a counter is incremented for each valid signal detected during a given number of detection pulses, the count reaching a predetermined number to indicate acknowledgment of the receipt of a valid signal. In a preferred embodiment, the counter also will be decremented for each invalid pulse received, providing a validity signal indicative of the net of valid less invalid pulses.

The absence of a validity signal can be used to trigger or validate the switching or multiplexing of a reader from one antenna to the next. Typically, the reader is multiplexed to the next antenna when no valid signal is received from the first antenna. This provides the ability to have fewer readers for more antennas.

In a preferred embodiment of the invention, two detectors are provided, one out of phase with the other. The reason for this is that the predetermined pulse stream has pulses with a given periodicity, with the pulses midway in between the regular pulses appearing only if the signal is a transition from a 1 to a 0 or vice versa, for the coding format employed. Accordingly, the in-between pulses are data-related and do not necessarily appear at every in between cycle. For the most rapid detection, therefore, two detectors are used, one out-of-phase with the other. One of the two (you do not need to know which one) will pick up the regular pulse stream; the other one, out-of-phase with the first, will pick up the data pulse stream. Normally the one picking up the regular pulse stream will count faster since it detects pulses every cycle compared with the other which only detects pulses in the event of certain data patterns. The outputs from these two detection circuits are counted and can be compared, with the higher one being used as the validity signal. This allows validity to be ascertained in the fastest manner.

BRIEF DESCRIPTION OF THE DRAWINGS

The invention will be better understood from the more detailed description which follows, making reference to the drawings in which:

FIG. 1 is a schematic circuit diagram of the pulse detection circuit of the invention; and FIG. 2 is a graph showing the various pulse streams of the invention at the indicated points A–E in FIG. 1.

DESCRIPTION OF THE PREFERRED EMBODIMENTS

Referring to the schematic of FIG. 1 and the graph of the various pulse streams of FIG. 2, it should be apparent that the pulse streams identified as A, B, C, D, and E in FIG. 2 are the streams appearing at the points A-E shown in FIG. 1. Pulse stream A is a sample of 8 bits of code which may result from the signal from an antenna after amplification, demodulation, and filtering. The format of this code is called "Manchester". In this format, a 1 is indicated, as shown for "BIT 1", as a transition from a high d.c. level to a low level, as shown in pulse sequence A. BIT 2, a binary 0, is the opposite, a transition from a low d.c. level to a high level. Pulse sequence A represents the binary pulse sequence 10010010.

Pulse sequence A shown in FIG. 2 is received, as shown in FIG. 1, at point A at the input 10 to the edge detection and pulse-forming circuit 11. The output of circuit 11 appears at point B in FIG 1 and is shown as pulse sequence B in FIG. 2. In the example shown, the pulses may appear a minimum of every 50 microseconds. In pulse sequence B in FIG. 2, for example, there is a 50 microsecond time between pulse edge 32 and pulse edge 33. However, there are 100 microseconds between pulse edge 31 and pulse edge 32. Every 100 microseconds after pulse edge 31, there is another pulse edge in pulse sequence B, as shown. However, if the first pulse edge received by the reader happened to be pulse edge 33, there is only one other pulse in pulse sequence B in synchronism at 100 microsecond intervals with pulse edge 33, and that is pulse edge 34 in pulse sequence B between BIT 5 and BIT 6. However, pulse edge 31 is the start of a series of eight regular pulse edges, one every 100 microseconds, for each of the 8 binary bits in pulse stream B, irrespective of whether they are 1's or 0's.

Pulse sequence B, representing the raw data, is fed into the synchronizer and detection pulse stream generator 12. Generator 12 serves to synchronize the detection pulse stream C with the first-received pulse edge in pulse stream B. The detection pulse stream supplied by generator 12 is shown in FIG 2 as pulse sequence C and it appears at point C in FIG. 1. Note that pulse sequence C has pulses every 50 microseconds, including pulses 35, 36 and 37 shown. Detection pulse stream generator 12 emits regular pulses at the minimum possible interval at which pulses may be received from edge detector 11 in FIG. 1 when a valid signal is being received.

Although pulse stream C is synchronized in edge detector 11 with the first received edge, it is not possible to ascertain from that edge whether that pulse represents one of the pulses appearing every 100 microseconds starting with pulse 31 in pulse sequence B, or whether it is the first of a stream starting with pulse 33, which only randomly appears every 100 microseconds in accordance with the data. Because of this ambiguity, pulse sequence C is fed to the input of flip-flop 18 as shown in FIG. 1. Remembering that detection pulse stream C has a regular pulse every 50 microseconds, flip-flop 18 flips back and forth with every detection pulse. The output of flip-flop 18 provides pulse sequences D and E. Pulse sequence D contains pulses 42, 44 and others every 100 microseconds which are out of phase with pulses 51, 53 and the rest of pulse stream E which also occur every 100 microseconds.

The pulses emitted by detection pulse stream generator 12 should be wide enough to bracket the window of the possible detection times of the pulse edges from the pulse stream B. As an example, assuming the minimum time between pulses is 50 microseconds in a valid pulse stream, detection pulse stream C emitted from pulse stream generator 12 could be designed to open a window at a time of about 37.5 microseconds from the receipt of the first pulse edge passed through edge detector 11, and to close it at 62.5 microseconds. This provides 12.5 microseconds on either side of each of the expected 50 microsecond spaced pulses to insure detection. Detection pulse stream C thus remains high for 25 microseconds for each expected pulse.

Thus out-of phase pulses D and E emitted from flip-flop 18 are used as enabling pulses to AND-gates 13 and 15, as shown in FIG. 1. AND-gate 15 is enabled by the pulses in pulse sequence D and AND-gate 13 by the pulses in pulse sequence E, which are out-of-phase with the pulses in pulse sequence D. Thus AND-gates 15 and 13 are enabled at different times, out of-phase with each other.

The input pulse stream A, after being passed through edge detector 11 to provide pulse sequence B shown in FIG. 2, is also fed as an input to AND gates 13 and 15. Since AND gates 13 and 15 are out-of-phase with each other, one of them is going to detect one set of pulse edges in pulse sequence B coincident with pulse edges 31 and 32 which appear every 100 microseconds. The other of the two AND-gates is going to detect pulse edges in phase with pulse edges 33 and 34 in pulse sequence B, which appear randomly. The circuitry of FIG. 1 is designed so that it doesn't matter which is which. For the purposes of illustration, we will assume that AND gate 13 detects the pulses synchronized in 100 microsecond intervals with pulse 31 and 32 in pulse sequence B, and AND gate 15 detects the pulses synchronized at 100 microsecond intervals with pulses 33 and 34 and those in phase at 100 microsecond intervals with them. In the example shown, therefore, AND-gate 13 will have more output pulses in a given time than AND gate 15 because AND gate 13 will emit an output pulse every 100 microseconds upon receipt of a valid signal at input 10, whereas AND-gate 15 will only emit signals randomly in accordance with the data.

The output pulse streams from AND-gates 13 and 15, respectively, pass through OR-gates 16 and 17 to counters 21 and 22, respectively. In the example chosen, counter 21 will count faster.

Counters 21 and 22 initially are reset by detection pulse stream generator 12 before the first edge is detected. The counters then may be reset to zero, but for reasons that will be explained later, it is preferred to reset the counters to 1. Reset is accomplished by a pulse sent from sample pulse signal may also be set at any level, depending on the number of pulses in an average signal and the number of "hits" which the user requires to reach a reasonable confidence that a valid signal is being received. As an example, this maximum may be 7. When the maximum is reached, a signal appears at the "limit out" terminal of counters 21 or 22, which is passed through OR-gate 23 to latch 24.

At the end of eight bit periods, the sample pulse generator 25 sends a sample pulse to the reset inputs of counters 21 and 22 and to latch 24. At that time, if OR-gate 23 is high as a result of one of counters 21 and 22 having reached a count of seven, which indicates receipt of a valid signal, latch 24 will be set by the sample pulse generator 25 to indicate validity. If neither counter has reached the limit, there will be no high signal through OR-gate 23 and latch 24 will not be set, indicating no valid signal has been received.

In the example where AND-gate 13 receives the regular, 100 microsecond pulses, counter 21 will reach the predetermined limit of seven first. Thus it will emit a limit or validity signal through OR-gate 23 to latch 24 indicating a valid pulse stream is being received. Alternatively, if the first edge detected happened to be edge 33 in pulse sequence B, and that pulse was passed through flip-flop 18 to AND-gate 13, the other AND gate 15 would be the one to receive the regular 100 microsecond pulses, such as pulses, 31 and 32 in pulse sequence B. Therefore counter 22 and not 21 would reach a count of seven faster and thus be the first to emit an output signal through OR gate 23 to latch 24. Obviously, a valid signal is a valid signal at the latch output 24—irrespective of which of counters 21 and 22 sent it.

Another feature of a preferred embodiment of the invention is the ability to decrement the count in counters 21 and 22 if invalid pulses are received. Invalid pulses are defined as pulses which appear outside the windows set by detection pulse stream C in FIG. 2. In other words, they are pulses which appear when the signal in pulse sequence C is low. Pulse Sequence C is emitted from detection pulse stream generator 12 and passed, as shown in FIG. 1, to an inverter input 19 of AND-gate 14, thus enabling AND-gate 14 during the low portion of pulse sequence C, but not during the high portion. Since all the pulse edges of pulse sequence B are sent to the other input of AND gate 14, AND-gate 14 will emit an output signal at anytime it detects a pulse edge outside of the proper expected windows defined by the pulses of pulse sequence C. Pulse sequence C also operates the up/down controls of counters 21 and 22. During the receipt of one of the pulses, such as 35, 36 or 37, of pulse sequence C, the up/down controls of counters 21 and 22 are set to count up (increment). In the absence of one of these pulses, when pulse sequence C is low, the up/down controls of counters 21 and 22 are changed so that the counters will count down (decreased). Since AND-gate 14 is also enabled out-of-phase with detection pulses 35, 36 and 37, its output signal passes through both OR-gates 16 and 17 to both counters 21 and 22 when AND-gate 14 receives an edge input (which must be invalid) while pulse sequence C is low. The counters are both then set to decrement, so they will reduce their count by 1.

What this means is for every good pulse received, either counter 21 or 22 will increment; for every bad pulse received, both counters 21 and 22 will decrement. The output of each of these counters, therefore, in this preferred embodiment, which passes through OR-gate 23 to latch 24, represents the net of good pulses less bad ones. The counters only provide a valid signal output when this net reaches seven in the example given. This puts an extra requirement on the validation of the signal.

Because of the possibility of an initial down count if noise is being received at the start, it has been found preferable to reset counters 21 and 22 to an initial 1 rather than a 0. The counters are reset every eight bit periods by a sample pulse from sample pulse generator 25. This permits the possibility of at least one initial decrement registering before the counter reaches 0 (the lowest possible count). Obviously, if the counters had been reset to 0, an initial down count would have had no effect.

The reader of this invention has multiple inputs for various antennas. It regularly and continuously must switch from one antenna to the next. Before each switch, its switching circuit (not shown) interrogates latch 24 to see if there has been an output signal from either counter, indicating that the antenna presently emitting signals is receiving a valid signal. If not, indicated by the absence of an output signal at latch 24, the reader switches to the next antenna in sequence. If there is a valid output signal at latch 24, no switching takes place until the complete signal has been received, at which time latch 24 will be reset to the opposite state unless another valid signal is then being received.

The circuitry of this invention is capable of picking out valid signals from transponders carried on moving objects such as railroad cars, automobiles or shipping containers, for example, from the amplified background noise, such as from fluorescent lights, random microwave transmission or the like which is picked up in the absence of other signals. Because the presence of a valid signal may be quickly ascertained before it has been completely received, or its absence noted equally quickly, multiple antennas which receive signals from different sets of transponders may be serviced by the same reader with reduced risk of loss of valid signals.

Obviously modifications may be made to the preferred embodiments described above without deviating from the spirit and scope of the invention, which is defined in the claims which follow.

We claim:

1. A circuit for early detection of a predetermined pulse stream having a given periodicity, comprising:
   means for providing a detection pulse stream wherein the width of the pulses include the expected edges of said predetermined pulse stream;
   first and second detecting means connected to receive said predetermined pulse stream for detecting the presence of the expected pulse edges during the duration of every other pulse of said detected pulse stream, and for providing a first output signal in the event of such detection, said second detecting means being out of phase with said first detecting means, said first and second detecting means also detecting the presence of a pulse edge in said predetermined pulse stream in the absence of coincidence with a pulse of said detection pulse stream, and providing a second output signal in the event of such detection; and
   means for counting the number of said first output signals and said second output signals from each of said first and second detecting means and for providing a validity signal depending on a predetermined net number of said first output signals received from the one of the first and second detection means having the higher count for a given number of detection pulses.

2. The circuit of claim 1 wherein said means for counting is incremented once for the receipt of each first output signal and decremented once for the receipt of each second output signal, and said means for counting provides said validity signal when its net count reaches said predetermined net number.

* * * * *